United States Patent [19]

Geissler et al.

[11] Patent Number: 6,127,091

[45] Date of Patent: Oct. 3, 2000

[54] PHOTOPOLYMERIZABLE COMPOSITION AND PHOTOPOLYMERIZABLE RECORDING MATERIAL PREPARED USING THIS COMPOSITION

[75] Inventors: Ulrich Geissler, Hochheim/Main; Hans-Dieter Frommeld; Hans Ruckert, both of Wiesbaden, all of Germany

[73] Assignee: Morton International, Inc., Chicago, Ill.

[21] Appl. No.: 08/963,136

[22] Filed: Nov. 3, 1997

Related U.S. Application Data

[63] Continuation of application No. 08/655,280, May 15, 1996, abandoned, which is a continuation of application No. 08/437,609, May 9, 1995, abandoned, which is a division of application No. 08/304,714, Sep. 12, 1994, abandoned, which is a continuation of application No. 08/212,692, Mar. 14, 1994, abandoned, which is a continuation of application No. 07/747,145, Aug. 19, 1991, abandoned.

[30] Foreign Application Priority Data

Aug. 29, 1990 [DE] Germany ............................ 40 27 301

[51] Int. Cl.[7] ............................................ G03C 1/73
[52] U.S. Cl. ................................. 430/271.1; 430/281.1; 430/920; 430/922
[58] Field of Search ..................... 430/271.1, 270.1, 430/281.1, 920, 922, 907, 909; 522/26, 50

[56] References Cited

U.S. PATENT DOCUMENTS

| | | | |
|---|---|---|---|
| 4,619,885 | 10/1986 | Wingen et al. | 430/271.1 |
| 4,632,897 | 12/1986 | Barzynski et al. | 430/281.1 |
| 4,940,648 | 7/1990 | Geiger | 430/281.1 |
| 4,978,604 | 12/1990 | Banks et al. | 430/281.1 |

FOREIGN PATENT DOCUMENTS 57-104135  6/1982  Japan .

OTHER PUBLICATIONS

Allen, Norman. Photopolymerisation and Photoimaging Science and Technology, pp. 160–165 and 236–239, 1989.

Kosar, Jaromir. Light–Sensitive Systems: Chemistry and Application of Nonsilver Halide Photographic Processes, pp. 184–187, 1965.

*Primary Examiner*—Maria Nuzzolillo
*Assistant Examiner*—Laura Weiner
*Attorney, Agent, or Firm*—Robert M. Didrick; Charles N. Lovell; Gerald K. White

[57] ABSTRACT

A photopolymerizable composition, which contains a polymeric binder, a compound which can be polymerized by free radicals and has at least one terminal ethylenic double bond and a photoinitiator combination comprising an N-heterocyclic compound, a thioxanthone derivative and a dialkylamino compound, is highly photosensitive and produces photoresist stencils with vertical side walls.

2 Claims, No Drawings

PHOTOPOLYMERIZABLE COMPOSITION AND PHOTOPOLYMERIZABLE RECORDING MATERIAL PREPARED USING THIS COMPOSITION

This is a continuation of application Ser. No. 08/655,280 filed on May 15, 1996 now abandoned; which is a Continuation of Ser. No. 08/437,609 filed on May 9, 1995 now abandoned; which is a Division of Ser. No. 08/304,714 filed on Sep. 12, 1994 now abandoned; which is a Continuations of Ser. No. 08/212,692 filed on Mar. 14, 1994 now abandoned; which is a Continuation of Ser. No. 07/747,145 filed on Aug. 19, 1991, now abandoned.

BACKGROUND OF THE INVENTION

The invention relates to a photopolymerizable composition comprising a polymeric binder, an ethylenically unsaturated compound which can be polymerized by free radicals and a photoinitiator. The invention further relates to a photopolymerizable recording material comprised of a support layer and a photopolymerizable layer comprising the above-indicated photopolymerizable composition. The compositions and materials of the invention are useful in the production of printing plates, relief images and photoresists.

A great number of photoinitiators have been disclosed in the patent literature. Examples of these are benzophenone, 4,4'-bis-dialkylamino-benzophenones, anthraquinones, thioxanthone derivatives, benzoins, benzoin ethers, 2,4,5-triarylimidazolyl dimers, acridine, phenazine and quinoline derivatives and trichloromethyl compounds, in particular trichloromethyl-s-triazines.

Combinations of two or more photoinitiators have also been described, for example, combinations of 4,4'-bis-dialkylamino-benzophenone with benzophenone or other compounds, combinations of benzoylmethylene-N-alkyl-naphthothiazoline and trihalomethyl triazines, combinations of a 2,4,5-triarylimidazolyl dimer and a p-aminophenylketone, combinations of dimethylthioxanthone and 4-dialkylamino-benzoates (see JP-A 82/23602), combinations of N-heterocyclic compounds, in particular acridine compounds, with compounds containing trichloromethyl groups (see EP-A 243 784) and combinations of these latter two components and photoreducible dyes (see EP-A 287,817).

DE-A 35 03 113 describes acylhaloacetic acid amide derivatives and mixtures of these photoinitiators with 4,4'-bis-dialkylamino-benzophenones, benzophenone derivatives or cyclic ketones. U.S. Pat. No. 3,661,588 discloses mixtures of photoinitiators comprising a p-aminophenyl ketone and an active methylene or amino compound. A mixture of N-phenylacridone and trihalomethyl compounds is described in DE-A 26 10 842.

Ternary photoinitiator systems have also been disclosed, for example, a mixture comprising a 4,4'-bis-dialkylamino-benzophenone, a benzophenone derivative and a compound containing a trihalomethyl group is described in DE-A 33 39 228.

An important field of application of compositions of this type is the preparation of dry resist materials. In this application, photoresist layers are used which have a thickness of the order of about 10 to about 100 $\mu$m. It is therefore essential that the side walls of the developed resist lines extend as far as possible in a vertical direction so that the line covered on the substrate, for example, on the circuit board, corresponds as close as possible to the artwork used. Dry resists should therefore meet, in particular, the following three requirements:

1. High photosensitivity
2. High resolution
3. Vertical side wall configuration

Although it has been possible to substantially increase photosensitivity by means of the known photoinitiator combinations, it has hitherto been impossible to at the same time improve the other two characteristics. As a general rule, high photosensitivity causes a positive side wall configuration, i.e. the resist line produced is wider at the base than at the upper edge. A positive or negative side wall configuration, in turn, results in impaired resolution.

SUMMARY OF THE INVENTION

It is therefore an object of the present invention to propose a photopolymerizable composition which meets the above-indicated three requirements.

This object is accomplished by providing a photopolymerizable composition which comprises a) a polymeric binder,
b) a compound which can be polymerized by free radicals and has at least one terminal ethylenic double bond,
c) an N-heterocyclic compound effective as a photoinitiator,
d) a thioxanthone derivative which acts as a photoinitiator of the formula I

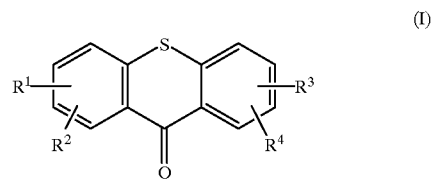

and
e) a dialkylamino compound which acts as a photoinitiator of one of the formulae II or III

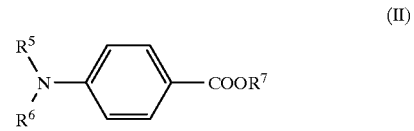

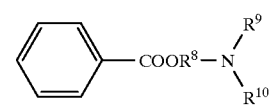

in which
$R^1$, $R^2$, $R^3$, and $R^4$ are independently selected from hydrogen or halogen atoms or alkyl, alkoxy, carboxyl, alkoxycarbonyl or aryloxycarbonyl groups,
$R^5$, $R^6$, $R^9$ and $R^{10}$ are independently selected from alkyl groups,
$R^7$ is selected from an alkyl or alkoxyalkyl group, and
$R^8$ a denotes an alkylene group.

It is further an object to provide a photopolymerizable recording material comprised of a support layer and a photopolymerizable layer which comprises the above components a)–e).

Further objects, features and advantages of the present invention will become apparent from the detailed description of the preferred embodiments that follows.

DETAILED DESCRIPTION OF THE PREFERRED EMBODIMENTS

Thioxanthones of the Formula I are preferably compounds in which at least two of the radicals $R^1$ to $R^4$, preferably three of these radicals, are hydrogen atoms. If these radicals are alkyl or alkoxy groups, they preferably contain 1 to 6 carbon atoms, most preferably 1 to 4 carbon atoms. The preferred aryloxycarbonyl groups are phenyloxycarbonyl groups, which may optionally be substituted by halogen atoms or $C_1$–$C_3$ alkyl groups. Chlorine and bromine atoms are the preferred halogen atoms of $R^1$ to $R^4$.

In the dialkylamino compounds of Formulae II and III, $R^5$, $R^6$, $R^9$ and $R^{10}$ are alkyl groups which preferably have 1 to 8, most preferably 1 to 4, carbon atoms. $R^7$ preferably is an alkyl group having 1 to 6, most preferably 1 to 3, carbon atoms or an alkoxyalkyl group preferably containing 2 to 8, most preferably 3 to 6, carbon atoms. $R^8$ preferably has 2 to 6 carbon atoms.

Preferred are compounds of the Formula I in which $R^1$ is alkyl and $R^2$ to $R^4$ are hydrogen; the preferred coinitiators are compounds of the Formula II.

As component c), any known N-heterocyclic compound capable of acting as a photoinitiator may be used. Examples of preferred N-heterocyclic compounds are described in DE-A 20 27 467. These are compounds of the acridine or phenazine type, which may contain an additional nitrogen atom as a heteroatom in one of the outer aromatic rings and may carry, on these rings, up to two fused benzene rings; they may also carry up to three identical or different substituents selected from H, halogen, alkyl, alkoxy, aryl, aryloxy, amino, acylamino or aralkenyl groups.

Further useful N-heterocyclic compounds which may be mentioned include quinoxalines and quinazolines, as described in DE-A 20 39 861. The substituted acridines described in EP-A 374 704 are also suitable for use.

Examples of other N-heterocyclic compounds are described in EP-A 220 589. These are quinolines, in particular 2,3-dihydro-1H-cyclopenta[b]quinolines of the general Formula IV

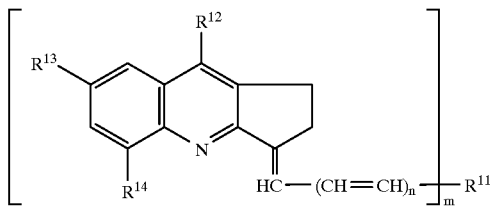

in which
- $R^{11}$ is a substituted or unsubstituted m-valent carbocyclic or a heterocyclic aromatic radical,
- $R^{12}$ is a hydrogen atom, an alkyl, aryl, aralkyl or aralkenyl group,
- $R^{13}$ and $R^{14}$ are identical or different and denote hydrogen or halogen atoms, alkyl or alkoxy groups,
- n is 0 or 1 and
- m is 1 or 2.

Suitable N-heterocycles also comprise 2-(aryl-vinyl)- and 2-(4-aryl-butadienyl)quinolines, as described in EP-A 11 786.

Typical N-heterocyclic compounds useful in the present invention include: 9-phenylacridine, 9-(p-tolyl)acridine, 9-(4-methoxyphenyl)acridine, 9-(4-hydroxyphenyl)acridine, 9-acetylaminoacridine, benz[a]phenazine, 8-methyl-benz[a]phenazine, 9,10-dimethyl-benz[a]phenazine, 9-methyl-benz[a]phenazine, 10-methyl-benz[a]phenazine, 9-methoxy-benz[a]phenazine, 10-methoxy-benz[a]phenazine, dibenz[a,c]phenazine, 11-methoxy-dibenz[a,c]phenazine, dibenz[a,j]phenazine. Of these, the most preferred include 9-phenylacridine, 9-(p-tolyl)acridine, benz[a]phenazine and 9-methyl-benz[a]phenazine, quinoxaline derivatives, for example, 6,4', 4"-trimethoxy-2,3-diphenylquinoxaline, 4', 4"-dimethoxy-2,3-diphenyl-5-azaquinoxaline, quinazoline derivatives, 2-styryl-quinoline, cinnamylidene-quinaldine and 3-(o-chloro-benzylidene)-9-phenyl-2,3-dihydro-1H-cyclopenta[b]quinoline.

The amount of components c), d), and e) are selected so as to provide a composition capable of forming a photoresist of high photosensitivity, high resolution and of vertical side wall configuration. In particular, the N-heterocyclic compound is preferably employed in an amount of about 0.01 to about 3.0% by weight, most preferably about 0.05 to about 1.0% by weight and the amount of thioxanthone and dialkylamino compound are preferably about 0.1 to about 4.0% by weight, most preferably about 0.2 to about 2.0% by weight, based on the entire composition. Preferably about 0.3 to about 3, most preferably about 0.5 to about 2 parts by weight of thioxanthone are used per part by weight of dialkylamino compound.

The quantitative ratio of thioxanthone+dialkylamino compound to N-heterocyclic compound is preferably in the range from about 1:1 to about 20:1, most preferably between about 2:1 and about 15:1.

The compositions of the present invention contain polymerizable compounds having at least one, preferably at least two, terminal ethylenic double bonds. Any compound meeting this requirement can be used. Preferred examples include esters of acrylic or methacrylic acid with polyhydric, preferably primary, alcohols. Suitable polyhydric alcohols include, for example, ethylene glycol, propylene glycol, butanediol-1,4, butanediol-1,3, diethylene glycol, triethylene glycol, polyethylene or polypropylene glycols preferably having molecular weights of 200 to 1,000, neopentyl glycol, glycerol, trimethylol ethane, trimethylol propane, pentaerythritol, bisphenol-A derivatives and reaction products of these compounds with ethylene oxide and/or propylene oxide. Bisacrylates and bismethacrylates containing urethane groups, which are obtained by reacting 1 mole of a diisocyanate with 2 moles of hydroxyalkyl acrylate or methacrylate, are also advantageously used as the polymerizable compound. The diisocyanate can also be an oligomeric product obtained by reacting a diol with a molar excess of a monomeric diisocyanate. Monomers of this type and similar useful monomers containing urethane groups are described in DE-A 20 64 079, 28 22 190, 30 48 502 and 35 40 480.

The quantitative proportion of monomers contained in the layer is preferably about 10 to about 75% by weight, most preferably 20 to 60% by weight.

Numerous types of organic polymers can be employed as binders. Preferred examples of these include polyamides, polyvinylesters, polyvinylacetals, polyvinylethers, epoxy resins, polyacrylates, polymethacrylates, polyesters, alkyd resins, polyacrylamide, polyvinyl alcohol, polyethylene oxide, polydimethylacrylamide, polyvinylpyrrolidone, polyvinylmethylformamide, polyvinylmethylacetamide, copolymers of the monomers forming the enumerated homopolymers and mixtures of any of the above.

Other suitable binders include natural substances or converted natural substances such as gelatin and cellulose ether.

It is particularly advantageous to use binders which are insoluble in water, but soluble or at least swellable in aqueous-alkaline solutions. Layers containing binders of this kind can be developed using the preferred aqueous-alkaline developers. Such binders may contain, for example, one or more of the following groups: —COOH, —PO$_3$H$_2$, —SO$_3$H; —SO$_2$NH—, —SO$_2$—NH—SO$_2$— or —SO$_2$—NH—CO—. Examples of these binders include: maleate resins, polymers of β-methacryloyloxyethyl-N-(p-tolylsulfonyl)-carbamate, copolymers of these and similar monomers with other monomers, copolymers of vinylacetate and crotonic acid, and copolymers of styrene and maleic anhydride. Alkylmethacrylate/methacrylic acid copolymers and copolymers of methacrylic acid, higher molecular weight alkylmethacrylates and methylmethacrylate and/or styrene, acrylonitrile and other monomers, as described in DE-A 20 64 080, 23 63 806 and 34 27 519 are preferred. Binders based on an α, β-unsaturated carboxylic acid, a methacrylate, an acrylate and a compound containing an aromatic substituent, which are described in DE-A 38 05 706, can also advantageously be used.

Other customary components which may be present in the composition include polymerization inhibitors, other stabilizers, hydrogen donors, photosensitivity regulators, dyes, leuco dyes, photooxidizing agents, for example, tribromomethyl-phenylsulfone, pigments, plasticizers and thermally activable crosslinking agents.

As actinic radiation to which the composition according to the invention is sensitive, any electromagnetic radiation can be employed whose energy is sufficient to start polymerization. Visible light, ultraviolet light, X-ray or electron radiation are particularly suitable. It is also possible to use laser radiation in the visible and ultraviolet regions. Preference is given to short-wave visible and near ultraviolet light.

Examples of support layers useful for the recording materials prepared with the composition of the present invention include aluminum, steel, zinc, copper, screens or plastics films, for example, polyethylene terephthalate films. The support surface can be pretreated by a chemical or mechanical process to properly adjust adhesion of the layer.

The composition according to the present invention is preferably used in the form of a dry transferable photoresist material. For this purpose, a prefabricated, transferable dry resist film prepared using the composition can be applied in a known manner to the workpiece to be processed, for example, to a support material for circuit boards. To prepare the dry resist material, a solution of the composition in a solvent is, in general, applied to a suitable support layer, for example, a polyester film, and dried. The resist layer can have a thickness of about 10 to about 80 μm, preferably about 20 to about 60 μm. The free surface of the layer may preferably be covered with a top film, for example, a film of polyethylene or polypropylene. The final laminate can be stored in a large-size roll which is cut into resist rolls of any required width.

The films can be processed by means of the equipment customarily employed in dry resist technology. In a commercial laminator, the top film is peeled off and the photoresist layer is laminated to a drilled, copper-plated support material. The board so prepared is then exposed to light through an original and, after removing the support film, developed as is known in the art.

Suitable developers include organic solvents, for example, trichloroethane, or aqueous, preferably, aqueous-alkaline, solutions, for example, of alkali metal phosphates, alkali metal carbonates or alkali metal silicates, to which small amounts of water-miscible organic solvents or wetting agents are optionally added.

The compositions according to the present invention can be used in various fields of application. They are particularly advantageously used in the form of a dry resist film for the production of resists, i.e. etch resist layers or electroplating resists, on metallic support materials, for example, copper.

Using the photoinitiator combination of the present invention, photoresist layers are obtained which exhibit high photosensitivity, excellent resolving power and vertical resist side walls, irrespective of the film original employed (positive or negative), whereas the use of the N-heterocyclic compound as the only photoinitiator leads to reduced resolution and positive resist side walls, which are particularly disadvantageous in electroplating applications and the use of the thioxanthone/amine mixture used alone gives rise to reduced photosensitivity with insufficient hardening of the resist base. In the latter case, the resist side walls obtained are positive if a positive original is used (electroplating application) or negative if a negative original is used (etching application). Both are disadvantageous in practical application.

The following examples illustrate preferred embodiments of the invention. Quantitative proportions and percentages are to be understood as relating to weight units, unless otherwise specified. The amounts of components are generally given in parts by weight (pbw). The letter (C) behind an example variant indicates that the latter is a comparative example.

EXAMPLE 1

Stock solutions were prepared, each of which was comprised of

| | | |
|---|---|---|
| 21 | pbw | of a polymer of methacrylic acid, acrylic acid, methyl methacrylate, butyl acrylate and styrene (16:5:42:27:10), added as a 50% strength solution (42 pbw) in ethanol/butanone 1:1, |
| 9 | pbw | of polyethylene glycol-400-dimethacrylate, |
| 0.45 | pbw | of leuco crystal violet, |
| 0.012 | pbw | of Victoria Pure Blue FGA (C.I. 42598) and |
| 0.03 | pbw | of tribromomethylphenyl-sulfone in |
| 27 | pbw | of butanone and |
| 22 | pbw | of ethanol |

The following photoinitiator combinations

| | | |
|---|---|---|
| A (C) | 0.06 pbw | of 9-phenylacridine, |
| B (C) | 0.24 pbw | of isopropylthioxanthone and |
| | 0.30 pbw | of 4-dimethylamino-ethyl benzoate or |
| C | 0.06 pbw | of 9-phenylacridine, |
| | 0.24 pbw | of isopropylthioxanthone and |
| | 0.30 pbw | of 4-dimethylamino-ethyl benzoate | were dissolved in separate stock solutions.

Biaxially stretched and heat-set, 25 μm thick polyethylene terephthalate films were spin-coated with the solutions such that in each case, after drying at 100° C., a layer weight of 45 g/m$^2$ was obtained.

A commercial laminator was used to laminate the dry resist films thus prepared at 115° C. to phenolic resin laminate boards clad with a 35 μm thick copper foil. A 5 kW metal halide lamp was then used for exposure in a vacuum copying frame through the below-described exposure originals 1 and 2 for 5 seconds and through exposure original 3 for 8 seconds, followed by development in a 1% strength sodium carbonate solution.

| Exposure original 1 | | dark transparent | 47 μm (lines) 300 μm (spaces) |
|---|---|---|---|
| width of | A (C) | — | non-resolved |
| channel | B (C) | 71/58 μm | positive resist |
| produced | | | side walls no |
| (top-edge/ | | | 1:1 reproduction |
| bottom edge) | | | resist lift-off |
| | C | 47/47 μm | vertical resist side walls 1:1 reproduction |
| Exposure original 2 | | dark transparent | 300 μm 46 μm |
| width of | A (C) | 46/50 μm | positive resist |
| resist | | | side walls |
| line (top edge/ | B (C) | 34/31 μm | negative resist side walls no 1:1 reproduction resist lift-off |
| bottom edge) | | | |
| | C | 45/45 μm | vertical resist side walls 1:1 reproduction |
| Exposure original 3 | | dark transparent | 71 μm 300 μm |
| channel | A (C) | — | non resolved |
| (top edge/ | B (C) | 85/76 μm | positive resist side walls no 1:1 reproduction |
| bottom edge) | | | |
| | C | 69/69 μm | vertical resist side walls 1:1 reproduction |

EXAMPLE 2

Stock solutions were prepared, each of which was comprised of

| 20 | pbw | of the polymer indicated in Example 1, added as a 50% strength solution (40 pbw) in ethanol/butanone 1:1, |
|---|---|---|
| 4 | pbw | of trimethylolpropane triacrylate, |
| 4 | pbw | of a diurethane obtained from 2 moles of hydroxyethylmethacrylate and 1 mole of 2,2,4-trimethyl-hexamethylene-diisocyanate, |
| 2 | pbw | of the product obtained by reacting 1 mole of hydroxyethylmethacrylate with 5 moles of ethyleneoxide and 1 mole of butylisocyanate, |
| 0.45 | pbw | of leuco crystal violet, |
| 0.012 | pbw | of Victoria Pure Blue FGA and |
| 0.03 | pbw | of tribromomethylphenyl-sulfone in |
| 26 | pbw | of butanone and |
| 13 | pbw | of ethanol. |

The following photoinitiators were added to separate stock solutions:

| A (C) | 0.06 | pbw | of 9-(4-methoxy-phenyl) acridine, |
|---|---|---|---|
| B (C) | 0.24 | pbw | of isopropylthioxanthone and |
| | 0.30 | pbw | of 4-dimethylamino-ethylbenzoate or |
| C | 0.06 | pbw | of 9-(4-methoxyphenyl)-acridine, |
| | 0.24 | pbw | of isopropylthioxanthone and |
| | 0.30 | pbw | of 4-dimethylamino-ethyl benzoate. |

By the method described in Example 1, dry resist layers were prepared by spin-coating. Following lamination the resists were exposed for 9 seconds through the below-described exposure originals 4, 5 and 6 and developed in a 1% strength sodium carbonate solution.

| Exposure original 4 | | dark transparent | 43 μm 300 μm |
|---|---|---|---|
| channel | A (C) | — | non resolved |
| (top edge/ | B (C) | 54/40 μm | positive resist side walls no 1:1 reproduction |
| bottom edge) | | | |
| | C | 44/42 μm | vertical resist side walls 1:1 reproduction |
| Exposure original 5 | | dark transparent | 56 μm 300 μm |
| channel | A (C) | 58/42 μm | positive resist side walls no 1:1 reproduction |
| (top edge/ | | | |
| bottom edge) | B (C) | 70/61 μm | as in A |
| | C | 56/54 μm | vertical resist side walls 1:1 reproduction |
| Exposure original 6 | | dark transparent | 65 μm 300 μm |
| channel | A (C) | 65/45 μm | positive resist side walls no 1:1 reproduction |
| (top edge/ | | | |
| bottom edge) | B (C) | 77/69 μm | as in A |
| | C | 66/64 μm | vertical resist side walls 1:1 reproduction |

As seen from the results, when phenylacridine is used alone, resolution is poorer and, at the same time, pronouncedly positive resist side walls and rounded resist edges develop. The thioxanthone/amine mixture produces reduced photosensitivity and there is no 1:1 reproduction of structures. In addition, resist side walls have a positive configuration, in particular in the case of fine structures.

EXAMPLE 3

Four stock solutions were prepared each of which was composed of

| 54 | pbw | of a polymer of methacrylic acid, methyl methacrylate and hexylmethacrylate (35:5:60), |
|---|---|---|
| 16 | pbw | of the diurethane obtained from 2 moles of hydroxyethyl-methacrylate and 1 mole of 2,2,4-trimethyl-hexamethylene-diisocyanate, |
| 30 | pbw | of polyethyleneglycol-400- |

|  |  |  |  |
|---|---|---|---|
|  | 0.1 | pbw | dimethacrylate, of 1,4-bis-(4-tert.butoxyphenyl-amino)-5,8-dihydroxy-anthraquinone and |
|  | 0.05 | pbw | of Samaron Navy Blue HR (C.I. Disperse Blue 290) |
| in |  |  |  |
|  | 110 | pbw | of butanone and |
|  | 110 | pbw | of ethanol |
| and |  |  |  |
| A (C) | 0.5 | pbw | of 9-methylbenz[a]phenazine, |
| B | 0.5 | pbw | of 9-methylbenz[a]phenazine, |
|  | 0.5 | pbw | of isopropylthioxanthone and |
|  | 0.5 | pbw | of 4-dimethylaminobutyl-benzoate, |
| C (C) | 0.5 | pbw | of 2,3-bis(p-methoxyphenyl)-6-methoxyquinoxaline, |
| D | 0.5 | pbw | of 2,3-bis(p-methoxyphenyl)-6-methoxy-quinoxaline, |
|  | 0.5 | pbw | of isopropylthioxanthone and |
|  | 0.5 | pbw | of 4-dimethylamino-butyl benzoate | were added as photoinitiators.

As described in Example 1, the solutions were applied to polyethylene terephthalate film and dried.

The resist films were also laminated onto phenolic resin laminate boards clad with copper foil and then exposed under an original comprising a line pattern of 50 μm wide black lines and 50 μm wide spaces and a gray step wedge, such that after developing by means of a 1% strength sodium carbonate solution (30° C., spraying for 45 seconds) the resist under step 8 (optical density 1.18) was still sufficiently hardened and remained on the support, while the resist under step 9 (optical density 1.33) was dissolved by the developer and removed.

The resolution obtained was then evaluated.

Samples B and D according to the invention gave an excellent reproduction of the 50 μm bar pattern. In Samples A and C the exposed bars had "grown together", i.e. even under the black lines, a certain degree of photocrosslinking and photohardening had taken place.

What is claimed is:

1. A photopolymerizable recording material which comprises a support layer and a photopolymerizable layer sensitive to ultraviolet and near- ultraviolet light, said photopolymerizable layer comprising a) a polymeric binder, b) a compound which can be polymerized by free radicals and has at least one terminal ethylenic double bond, c) a photoinitiator combination which is sufficient to start polymerization under ultraviolet and near-ultraviolet light consisting essentially of 1) a N-heterocyclic compound effective as a photoinitiator selected from the group consisting of acridines, phenazines, quinoxalines and quinolines, 2) a thioxanthone derivative of the formula I

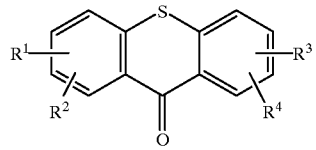

and 3) a dialkylamino compound of the formula II or III

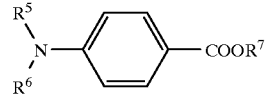

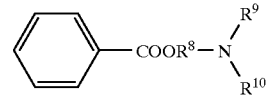

in which $R^1$, $R^2$, $R^3$, and $R^4$ are independently selected from the group consisting of halogen, alkyl, alkoxy, carboxyl, alkoxycarbonyl and aryloxycarbonyl, $R^5$, $R^6$, $R^9$ and $R^{10}$ which may be the same or different, denote alkyl groups, $R^7$ is an alkyl or alkoxyalkyl group, and $R^8$ denotes an alkylene group.

2. A photopolymerizable recording material as claimed in claim 1, wherein said support layer comprises a flexible transparent plastic film which is detachably connected to the photopolymerizable layer and said photopolymerizable layer carries, on its surface facing away from said support layer, a flexible top film, wherein said top film adheres less to the photopolymerizable layer, than the support layer adheres to the photopolymerizable layer, so that the top film can be peeled off without peeling off the photopolymerizable layer from the support layer.

* * * * *